United States Patent [19]
Oliver et al.

[11] Patent Number: 5,335,253
[45] Date of Patent: Aug. 2, 1994

[54] NON-INTEGRAL FREQUENCY DIVISION USING REGULATED DIGITAL DIVIDER CIRCUITS

[75] Inventors: David C. Oliver, San Antonio, Tex.; Micheal J. Petrillo, Twinsburg, Ohio

[73] Assignee: Gould, Inc., Eastlake, Ohio

[21] Appl. No.: 955,350

[22] Filed: Oct. 1, 1992

[51] Int. Cl.$^5$ .............................................. H03K 21/40
[52] U.S. Cl. ........................................ 377/48; 377/50
[58] Field of Search .................................... 377/48, 50

[56] References Cited

U.S. PATENT DOCUMENTS

| | | | |
|---|---|---|---|
| 3,818,354 | 6/1974 | Tomisawa et al. | 328/41 |
| 3,935,538 | 1/1976 | Kizler et al. | 328/3 X |
| 4,081,755 | 3/1978 | Howard | 328/41 |
| 4,241,408 | 12/1980 | Gross | 364/703 |
| 4,306,461 | 12/1981 | Grebe, Jr. | 73/861.12 |
| 4,555,793 | 11/1985 | Benamy | 377/48 |
| 4,573,176 | 2/1986 | Yeager | 377/50 |
| 4,658,406 | 4/1987 | Pappas | 377/48 |
| 5,224,132 | 6/1993 | Goldberg | 377/48 |

OTHER PUBLICATIONS

Zia, Yongping, "Divider Splits the Divisor", Department of Electrical Engineering, West Virginia University, Morgantown, W.V., EDN Jun. 6, 1991, p. 174.

*Primary Examiner*—Margaret Rose Wambach
*Attorney, Agent, or Firm*—Renner, Otto, Boisselle & Sklar

[57] ABSTRACT

The frequency divider of the present invention includes one or more regulated digital divider circuits, each of which is made up of a finite state machine such as a general purpose counter. The regulated digital divider circuits can be cascaded such that the frequency divider provides a high degree of precision within only a few stages, regardless of the division ratio. The frequency divider has an output duty cycle which is adjustable so as to provide a more useful output than existing frequency dividers. Moreover, the frequency divider can be implemented using simple logic circuitry and virtually any architecture.

13 Claims, 6 Drawing Sheets

FIG. 1

FIG. 2 m':n WHERE m' IS PREFERABLY EQUAL TO 1 OR n-1

NON-INTEGRAL FREQUENCY DIVISION USING REGULATED DIGITAL DIVIDER CIRCUITS

TECHNICAL FIELD

The present invention relates generally to frequency dividers and, more particularly, to a non-integral frequency divider using regulated digital divider circuits.

BACKGROUND OF THE INVENTION

Non-integral frequency dividers are known in the art. Non-integral frequency dividers divide a reference frequency according to a non-integral division ratio to produce a desired output frequency. Unfortunately, there are several drawbacks associated with existing non-integral frequency dividers. For example, existing non-integral frequency dividers are typically restricted in application and/or introduce undesirable complexity which results in increased cost.

A particular example of a known non-integral frequency divider includes a phased locked loop used with a pair of integral dividers to synthesize the desired frequency. However, the components in a phase locked loop are typically large, difficult to integrate into a digital integrated circuit, and can be mechanically delicate, therefore affecting the reliability, cost and application of such a frequency divider. In addition, the phase locked loop may exhibit an undesirable start up or settling time, which must be taken into account during design.

Other examples of non-integral frequency dividers are described in U.S. Pat. Nos. 3,818,354 to Tomisawa et al. and 4,555,793 to Benamy. The '354 patent describes a pulse frequency dividing circuit which utilizes ring counters formed with shift registers. The use of ring counters, however, typically requires large division ratios and results in a frequency dividing circuit with very limited application. Moreover, the frequency dividing circuit using ring counters is efficient as far as component cost only for select division ratios. The efficiency of such a frequency dividing circuit for other division ratios decreases substantially as will be appreciated by those familiar in the art. The '793 patent describes a non-integer frequency division apparatus which employs a shift register. However, it will be appreciated that the precision of such a frequency dividing circuit is limited and increases approximately only linearly with the size of the shift register.

In view of the aforementioned shortcomings associated with existing non-integral frequency dividers, there is a strong need in the art for a non-integral frequency divider which can perform high precision division for an arbitrary division ratio. Furthermore, there is a strong need for such a frequency divider which employs only simple logic circuitry and is cost efficient. In addition, there is a strong need in the art for a non-integral frequency divider which is capable of small division ratios and can be used in a large range of applications.

SUMMARY OF THE INVENTION

The non-integral frequency divider of the present invention overcomes the aforementioned shortcomings associated with existing non-integral dividers. In particular, the present invention relates to a high-precision, non-integral frequency divider which is simple in design and is cost efficient. The frequency divider is functional over a large range of applications and is capable of small division ratios.

The frequency divider of the present invention includes one or more regulated digital divider circuits, each of which is made up of a finite state machine such as a general purpose counter. The regulated digital divider circuits can be cascaded such that the frequency divider provides a high degree of precision within only a few stages, regardless of the desired division ratio. The frequency divider has an output duty cycle which is adjustable so as to provide a more useful output than existing frequency dividers. Moreover, the frequency divider can be implemented using simple logic circuitry and virtually any architecture.

According to one aspect of the present invention, a non-integral frequency divider circuit is provided including first finite state machine means for selectively dividing an input frequency by a first value or a second value as a function of a control input, and second finite state machine means for providing the control input. According to a preferred embodiment, the second finite state means includes means for dividing an output of the first finite state machine means by a third value, and wherein an output of the second finite state machine serves as the control input to the first finite state machine means.

According to another aspect of the present invention, a non-integral frequency divider circuit is provided which includes a plurality of finite state machines, each of the finite state machines comprising regulated divider means for selectively dividing an input by a first value or a second value as a function of a control input; and wherein the plurality of finite state machines are cascaded together in series such that an output of one of said finite state machines serves as the input to a next of the finite state machines in the series, and an output of the next finite state machine serves as the control input to the one finite state machine in the series.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DESCRIPTION OF THE PREFERRED EMBODIMENTS

The non-integral frequency divider of the present invention will now be described with reference to the drawings wherein like reference labels are used to refer to like elements throughout.

Figures 1, 2:
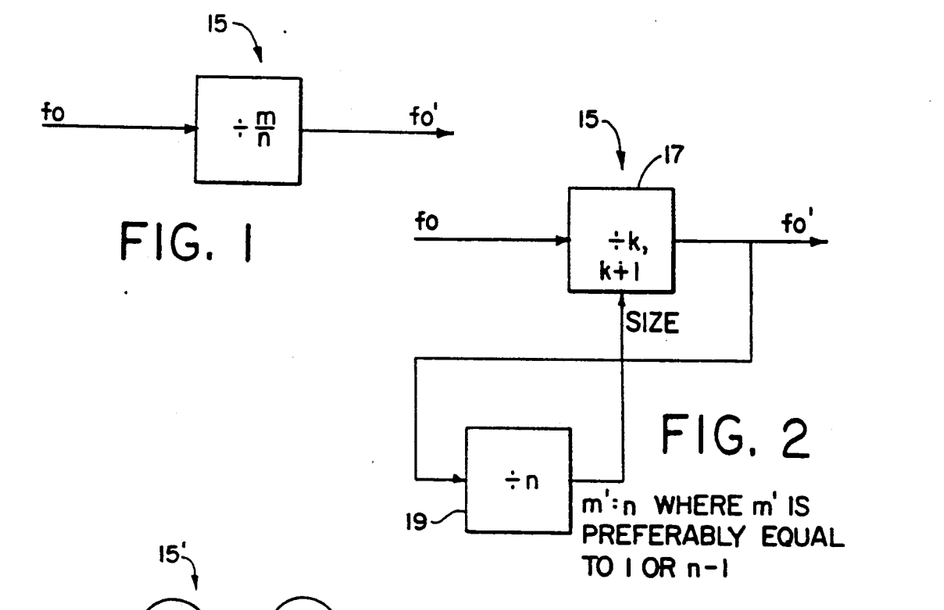
FIG. 1 is a block diagram of a non-integral frequency divider in accordance with the present invention.
FIG. 2 is a block diagram of a regulated divider circuit and feedback divider circuit in accordance with the present invention.

Referring to FIG. 1, a non-integral frequency divider 15 is shown in accordance with the present invention. The frequency divider 15 receives an input frequency $f_o$ which is provided from an oscillator or any other signal source as will be appreciated. The frequency divider 15 divides the input frequency $f_o$ by the desired division ratio m/n to produce an output frequency $f_o'$ such that:

$$f_o' = \frac{f_o}{m/n}$$

where m and n are integers and m/n is a non-integral value.

It will be understood that the frequency ratio m/n can be represented as follows:

$$\frac{m}{n} = k + \frac{m'}{n}$$

where k = m div n and m' = m mod n.

The "div" operator, as will be appreciated, represents an integral divide, e.g., 1 div 3=0; 2 div 3=0; and 4 div 3=1. The "mod" operator represents the modulus (or the remainder) of an integral divide, e.g., 1 mod 3=1; 2 mod 3=2; and 4 mod 3=1.

The frequency divider 15 in the preferred embodiment is made up of one or more finite state machines which form a divider by either k or k+1, depending on the value of a control input. For example, FIG. 2 represents the frequency divider 15 as including a regulated digital divider circuit 17 which functions as a divide-by-k or divide-by-k+1 divider, depending on the value of a "size" control input. The size input controls the division ratio of the regulated digital divider circuit 17 which, in turn, regulates the output frequency $f_o'$. The size input provides such control via a multiplexer or other conventional switching means as described below with respect to Example 3. The size input preferably is asserted for m' out of each n cycles of $f_o'$ as is described in detail below. This can be accomplished by using a feedback divider circuit 19 which produces the size input by dividing the output frequency $f_o'$ by n and feeding the result back to the regulated digital divider 17 as the size input.

The present invention is described below with reference to a number of specific examples. Generally, however, the regulated digital divider circuit 17 and the feedback divider circuit 19 are both finite state machines. The finite state machines can be either asynchronous or synchronous circuits, and are designed and simplified using conventional finite state machine design and construction techniques (e.g., using D-type flip flops, etc.) as will be appreciated. In an embodiment where it desired that the output frequency $f_o'$ best approximate a square wave with a fifty percent duty cycle, the regulated digital divider circuit 17 is designed such that the output frequency $f_o'$ is asserted during a contiguous half (or as close to half as possible) of the states and is not asserted during the remaining contiguous states.

As is mentioned above, the feedback divider circuit 19 is designed such that the size input is asserted for m' out of each n cycles of $f_o'$. Moreover, the size input should be asserted at the highest possible subharmonic of $f_o'$ as possible, i.e., active for either 1/n or (n−1)/n of the contiguous states, in order to ensure that the phase error of $f_o'$ is within one period of $f_o$. Where this is not directly possible (e.g., m' is not equal to 1 or n−1), additional precision can be achieved at the output frequency $f_o'$ by cascading together additional regulated divider circuits 17 in series as is described below with respect to Examples 2 and 3.

EXAMPLE 1

Figure 3:
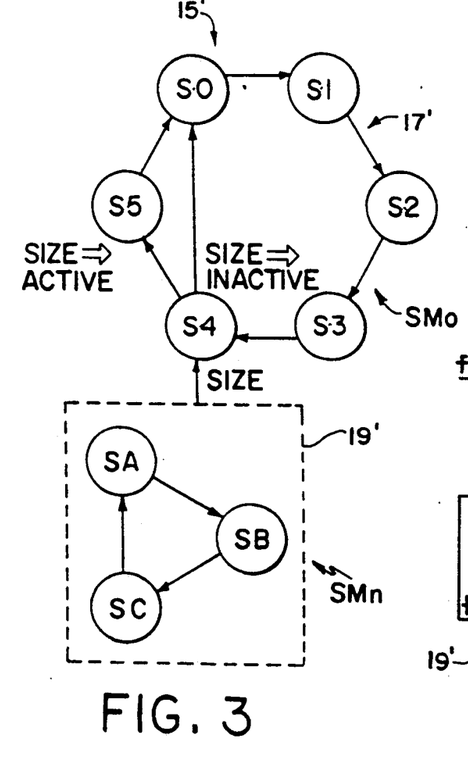
FIG. 3 is a state diagram of a non-integral frequency divider according to one embodiment of the present invention.

A first example of the present invention will now be described with reference to FIGS. 3, 4A and 4B. In this particular example, a non-integral frequency divider 15' is designed to have a division ratio of $$\frac{m}{n} = \frac{17}{3}$$

and therefore, k=5 and m'=2.

Figure 4A:
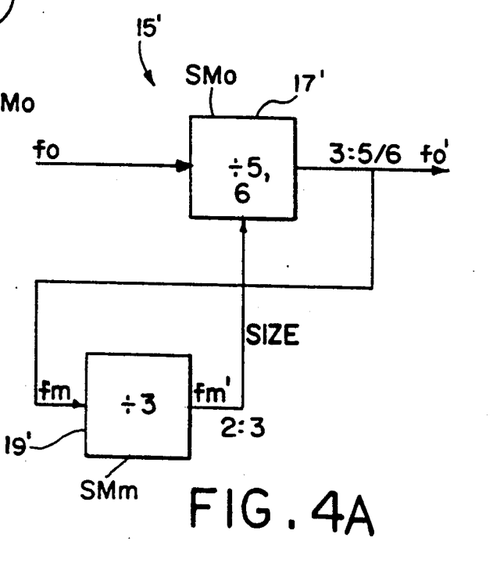
FIG. 4A is a block diagram of the non-integral frequency divider represented in FIG. 3 according to the present invention.

Applying the principles discussed above with respect to FIG. 2, the frequency divider according to the present invention will have a regulated digital divider circuit 17' (FIG. 4A) which functions as a divide-by-5 or a divide-by-6 divider, depending on the value of a size input provided from the feedback divider circuit 19' (FIG. 4A).

The regulated digital divider circuit 17' and the frequency divider circuit 19' are both finite state machines. More specifically, FIG. 3 illustrates the state diagrams of finite state machines $SM_o$ and $SM_m$ which form such a regulated digital divider circuit 17' and the feedback frequency divider 19', respectively. The finite state machine $SM_o$ includes six (k+1) states S0-S5. The state transition path defined by the states S0-S1-S2-S3-S4-S5 forms a divide-by-6 (k+1) divider, and the path defined by the states S0-S1-S2-S3-S4 forms a divide-by-5 (k) divider. Depending on the value of the size input from the finite state machine $SM_n$, the state transition path from state S4 is either to state S5 (forming a divide-by-6 divider), or is directly to state S0 (forming a divide-by 5 divider). The finite state machine $SM_n$ includes three states, SA, SB and SC, which form a simple divide-by-3 circuit.

FIG. 4A is a block diagram of the frequency divider 15' according to the preferred embodiment. The regulated digital divider circuit 17' divides the reference frequency $f_o$ by five or six, depending on the value of the size input provided from the feedback divider circuit 19'. As is mentioned above, in this example the regulated digital divider circuit 17' is made up of the finite state machine $SM_o$, and the feedback divider circuit 19' is constructed using a finite state machine $SM_m$. The output frequency $f_o'$ from the regulated divider circuit 17' serves as the input frequency $f_m$ to the feedback divider circuit 19'. The output frequency $f_m'$ from the feedback divider circuit 19' serves as the size input to the regulated digital divider circuit 17'. When the signal $f_m'$ is asserted, e.g., the size input is "active", the regulated digital divider circuit 17' functions as a divide-by-6 divider. When the signal $f_m'$ forming the size input is not asserted, the regulated digital divider circuit 17' functions as a divide-by-5 divider as is represented in FIG. 3.

To best approximate a square wave with a fifty percent duty cycle, the finite state machine $SM_o$ is designed such that the output frequency $f_o'$ is asserted, e.g., "active", for the first contiguous half of the output states (or as close to half of the output states as possible). Thus, referring again to FIG. 3, the output $f_o'$ of the finite state machine $SM_o$ in states S0, S1 and S2 is active, whereas the output $f_o'$ in states S3, S4 and S5 is inactive. This output pattern can be accomplished using conventional finite state machine design techniques as will be appreciated. As a result, the output frequency $f_o'$ is asserted during three out of the five or six output states (denoted by 3:5/6), depending on the value of the size input. In order to minimize phase error as mentioned above, the output of the feedback divider circuit 19' is asserted for two out of three cycles (denoted by 2:3) of $f_o'$ (e.g., during states SA and SB).

Figure 4B:
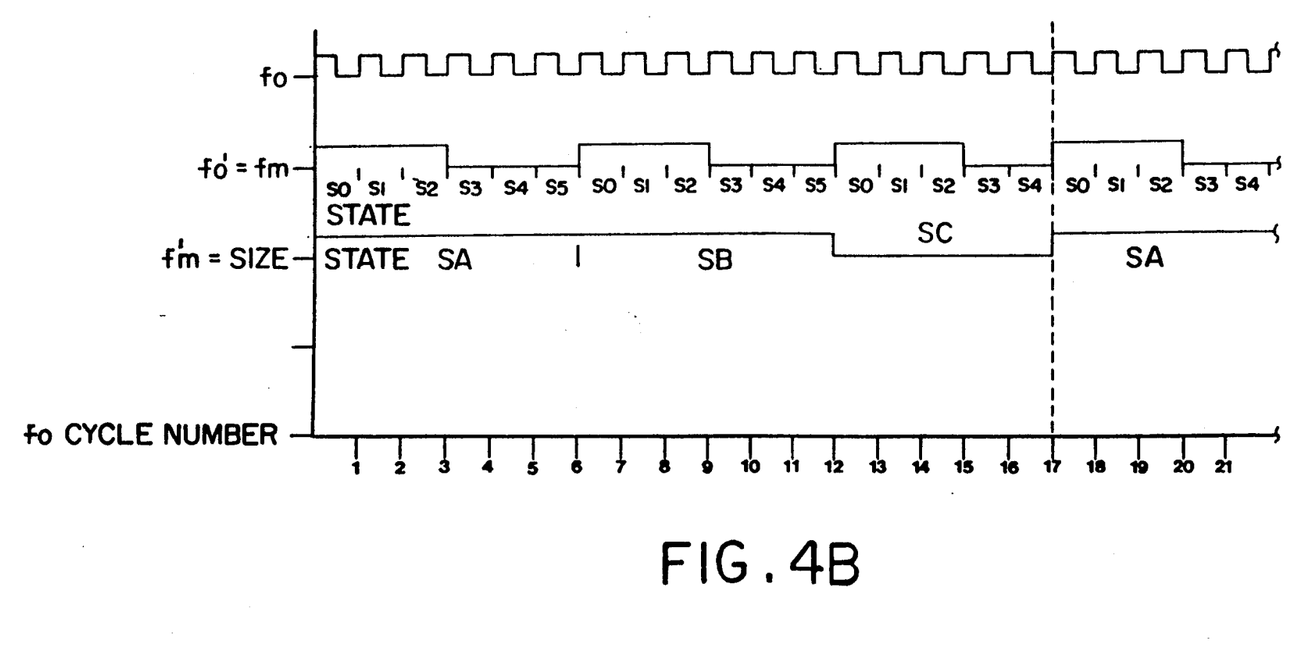
FIG. 4B is an exemplary timing diagram for the non-integral frequency divider of FIG. 3 according to the present invention.

FIG. 4B is an exemplary timing diagram illustrating the operation of the non-integral frequency divider 15' using an asynchronous circuit design. For the first twelve cycles of the input frequency $f_o'$ the size input is active and the regulated digital divider circuit 17' serves as a divide-by-6 divider with the output of the divider circuit 17' being active for the first three states S0–S2 and inactive during the states S3–S5. The size signal ($f_m'$) is active during the first two cycles of $f_o'$ and goes inactive beginning with the third cycle of $f_o'$. As a result, during the 12th through 17th cycles of the input frequency $f_o$, the regulated digital divider circuit 17' serves as a divide-by-5 divider. Ultimately, after seventeen cycles of the input frequency $f_o$ have occurred, exactly three cycles of the output frequency $f_o'$ will have occurred, thus providing the desired division ratio of 17/3.

EXAMPLE 2

An example of the present invention illustrating the manner in which the regulated digital divider circuits 17 are cascaded together to provide additional precision will now be described with reference to FIGS. 5A and 5B. In this particular example, the desired division ratio is $$\frac{m}{n} = \frac{27}{5}$$

and therefore, k=5 and m'=2.

As is noted above, the size signal should be active for m' out of each n cycles of the output frequency $f_o'$ in order to ensure that the phase error of $f_o'$ is within one period of $f_o$. In this particular example, m' out of n cycles refers to every two out of five cycles of the output frequency $f_o'$, or a division ratio of 5/2. Since 5/2 represents another non-integral division ratio, the present invention achieves such ratio by cascading another regulated digital divider circuit in series.

Figures 5A, 5B:
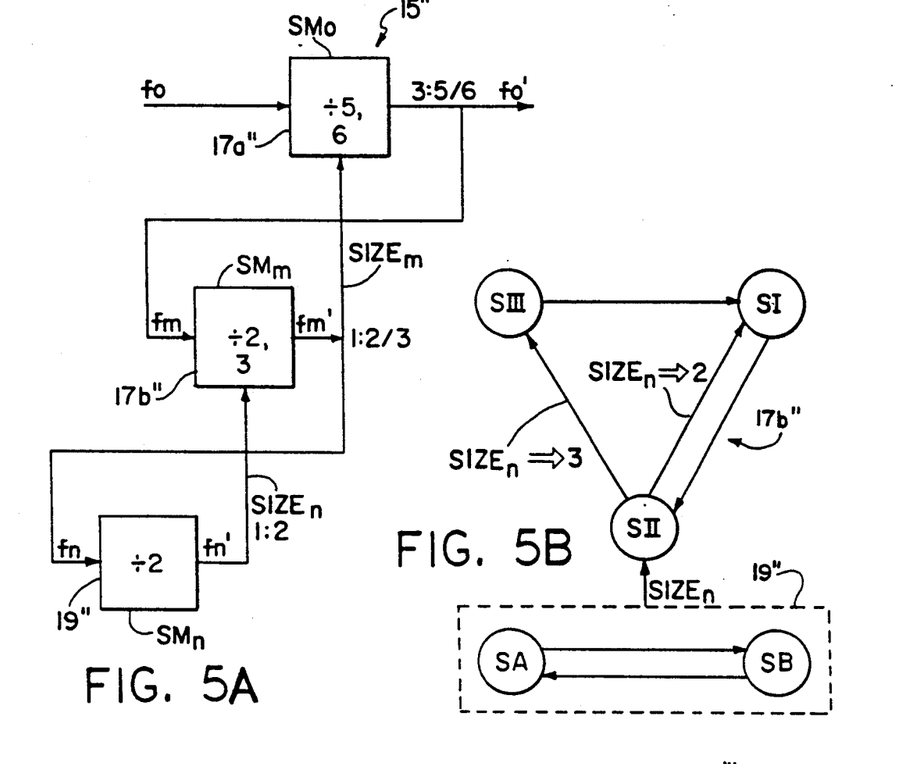
FIG. 5A is a block diagram of a non-integral frequency divider according to another embodiment of the present invention.
FIG. 5B is a partial state diagram of the non-integral frequency divider of FIG. 5A in accordance with the present invention.

More particularly, a non-integral frequency divider circuit 15'' having an overall division ratio of m/n equal to 27/5 is shown in FIG. 5A. The non-integral frequency divider circuit 15' includes a first regulated digital divider circuit 17a' made up of a finite state machine $SM_o$ which forms a divider by either 5 or 6 as a function of a size$_m$ input. The state diagram for the first regulated digital divider circuit 17a' is identical, for example, to that of the regulated digital divider circuit 17' shown in FIG. 3.

The output frequency $f_o'$ from the first regulated digital divider circuit 17a'' serves as the input frequency $f_m$ to a second regulated digital divider circuit 17b'' which is used for performing the above mentioned 2-of-5 division. In particular, the second regulated digital divider circuit 17b'' provides an output frequency $f_m'$ which serves as the size$_m$ input to the regulated digital divider circuit 17a'' according to the desired 5/2 division ratio.

Again applying the same principles described above, the second regulated digital divider circuit 17b'' is made up of a finite state machine $SM_m$ which forms a divider by either two or three, depending on the value of a size$_n$ input where m/n=5/2, k=2, and m'=1. The size$_n$ input is provided by a divide-by-2 feedback divider circuit 19'' consisting of a finite state machine $SM_n$ having an output $f_n'$. Exemplary state diagrams for the second digital divider circuit 17b'' and the feedback divider circuit 19'' are provided in FIG. 5B.

Figure 5C:
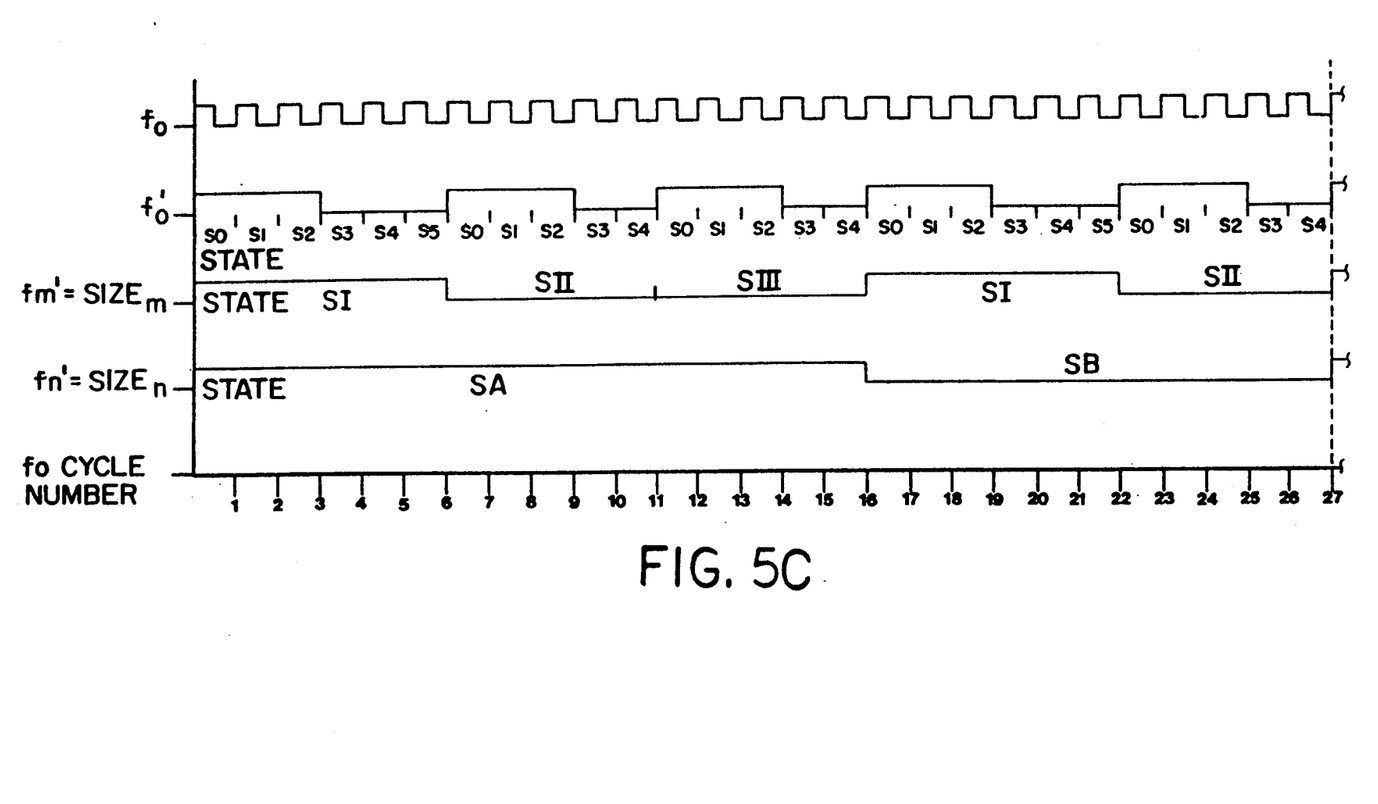
FIG. 5C is an exemplary timing diagram for the non-integral frequency divider of FIG. 5A according to the present invention.

Preferably, the output frequency $f_n'$ from the feedback divider circuit 19'' is asserted one out of every two cycles of the output frequency fm' (e.g., active during state SA, inactive state SB). Similarly, the outputs of the regulated digital divider circuits 17a'' and 17b'' are designed to be asserted during half the output states in each corresponding finite state machine $SM_o$ and $SM_m$ (e.g., active only during states S0-S2 and SI, respectively, as shown in FIG. 5C). As a result, the output $f_o'$ will closely resemble a square wave with a fifty percent duty cycle.

FIG. 5C is an exemplary timing diagram representing the operation of the non-integral frequency divider of FIG. 5A constructed using an asynchronous circuit design. As is shown, the first regulated digital divider circuit $17a''$ acts as a divide-by-6 divider when the output frequency $f_m'$ from the second digital divider circuit $17b''$ is active. When the output $f_m'$ is inactive as in states SII and SIII, the first regulated digital divider circuit $17a''$ functions as a divide-by-5 divider.

Similarly, when the output $f_n'$ from the feedback frequency divider $19''$ is active (as in state SA), the second regulated digital divider circuit $17b''$ functions as a divide-by-3 divider. When the output $f_n'$ is inactive (as in state SB), the second regulated digital divider circuit $17b''$ functions as a divide-by-2 divider of the output $f_o'$ from the first digital divider circuit $17a''$. As a result, it can be seen from FIG. 5C that the desired 27:5 division ratio is produced by the non-integral frequency divider $15''$.

The above described procedure of cascading together regulated digital divider circuits can be repeated until any desired precision in division ratio and/or phase error is achieved. Thus, while FIG. 5A includes only two regulated digital divider circuits $17a''$ and $17b''$ cascaded together, additional regulated digital divider circuits $17''$ can be added, if necessary, to improve further the division ratio and/or phase error precision.

Furthermore, it will be appreciated that the non-integral frequency divider of the present invention can be designed to provide an output frequency with a duty cycle different from the above described 50% square wave. By changing the output values of one or more states in the finite state machine or machines making up the regulated digital divider circuits 17, different duty cycles can be obtained. For example, the duty cycle of the output $f_o'$ is a function of the output values of the state machine $SM_o$ in FIG. 5A, e.g., the number of states giving a "1" output versus the number of states giving a "0" output. By changing the output values of contiguous states in the state machine $SM_o$ (e.g., the respective output values of S0-S5 can be 100000, 110000, 111000, etc.), the duty cycle of $f_o'$ can be altered without affecting the division ratio.

EXAMPLE 3

Figure 6:
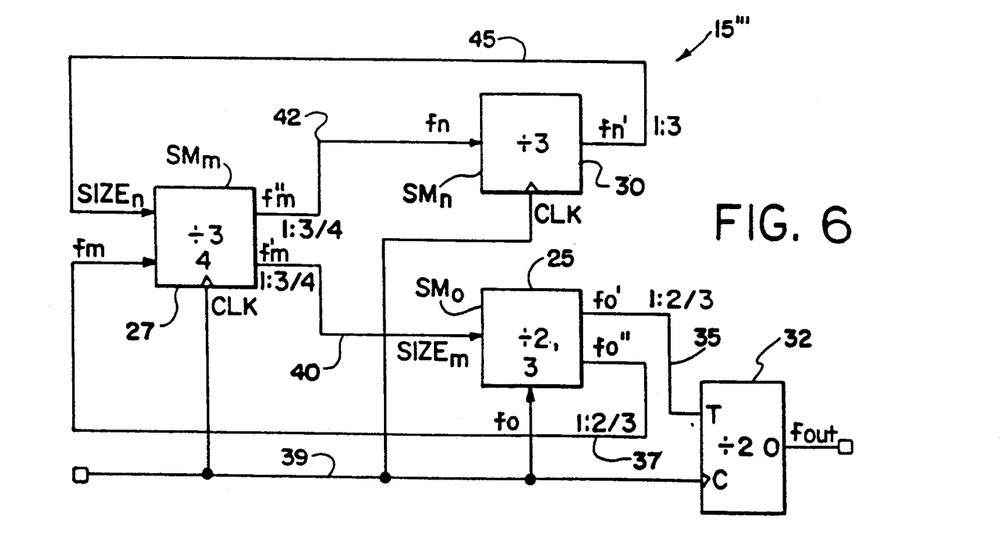
FIG. 6 is a block diagram of a non-integral frequency divider according to still another embodiment of the present invention.

Referring to FIGS. 6-10, and initially to FIG. 6, a preferred implementation of a non-integral frequency divider $15'''$ using the above described features will now be described. In this particular example, the desired division ratio from the non-integral frequency divider $15'''$ is 41/18, such that $$f_o' = \frac{f_o}{41/18}.$$

This is achieved according to the principles described above using a first regulated digital divider circuit 25 which forms a divide-by-2 or divide-by-3 divider to produce an output frequency $f_o'$. The first regulated digital divider circuit 25 is regulated by a second regulated digital divider circuit 27 which forms a divide-by-3 or divide-by-4 divider.

The second regulated digital divider circuit 27 is regulated, in turn, by a feedback divider circuit 30 which consists of a divide-by-3 divider. A final divide-by-2 divide 32 is located at the output $f_o'$ of the first regulated digital divider circuit 25 so as to result in an overall division ratio of 41/9. It will be appreciated, however, that the final divide-by-2 can be omitted in another embodiment where the division ratios of the regulated divider circuits are calculated to provide the overall division ratio of 41/9 without using a final divide-by-2 divider.

Describing now the non-integral frequency divider $15'''$ in more detail, and the first regulated digital divider circuit 25 initially, a primary output $f_o'$ (representing the divided output frequency) is connected via a line 35 to the input of the final divide-by-2 divider 32. The secondary output $f_o''$ is a single clock pulse wide output at the same frequency as $f_o'$ and is used to clock synchronously the second regulated digital divider circuit 27. As is shown, the secondary output $f_o''$ is provided on line 37 from the first regulated digital divider circuit 25 and is connected to the $f_m$ input of the second regulated digital divider circuit 27. The input frequency $f_o$ to the first regulated digital divider circuit 25 is provided on line 39 from an external reference such as a system clock which also serves as the clock for each of the respective state machines.

The $size_m$ input to the first regulated digital divider circuit 25 is provided on line 40 from the primary output $f_m'$ of the second regulated digital divider circuit 27. Again a secondary output $f_m''$ representing a single clock pulse wide output at the same frequency as $f_m'$ is used to clock synchronously the feedback divider circuit 30. As illustrated, the secondary output $f_m''$ is provided from the second regulated digital divider circuit 27 and is connected via line 42 to the $f_n$ frequency input of the feedback frequency divider circuit 30. The output $f_n'$ of the feedback frequency divider circuit 30 is coupled via line 45 to the second regulated digital divider circuit 27 and serves as the $size_n$ input.

According to the exemplary embodiment, the outputs $f_o'$ and $f_o''$ from the first regulated digital divider circuit 25 are asserted one out of every two or three input cycles of $f_o$ (denoted by 1:2/3), depending on the value of the $size_m$ input. Similarly, the outputs $f_m'$ and $f_m''$ from the second regulated digital divider circuit 27 are asserted one out of every three or four input cycles of $f_m$ (denoted by 1:3/4), depending on the value of the $size_n$ input. Finally, the output $f_n'$ from the feedback frequency divider 30 is asserted one out of every three input cycles of $f_n$.

Figure 7:
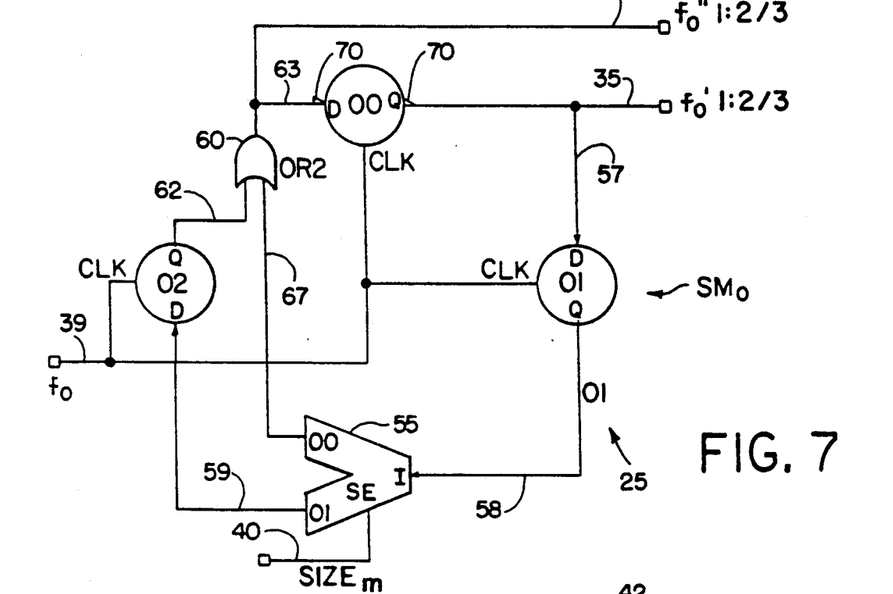
FIG. 7 is a schematic diagram of a first regulated digital divider circuit formed by a first finite state machine in the non-integral frequency divider of FIG. 6 in accordance with the present invention.
Figure 8:
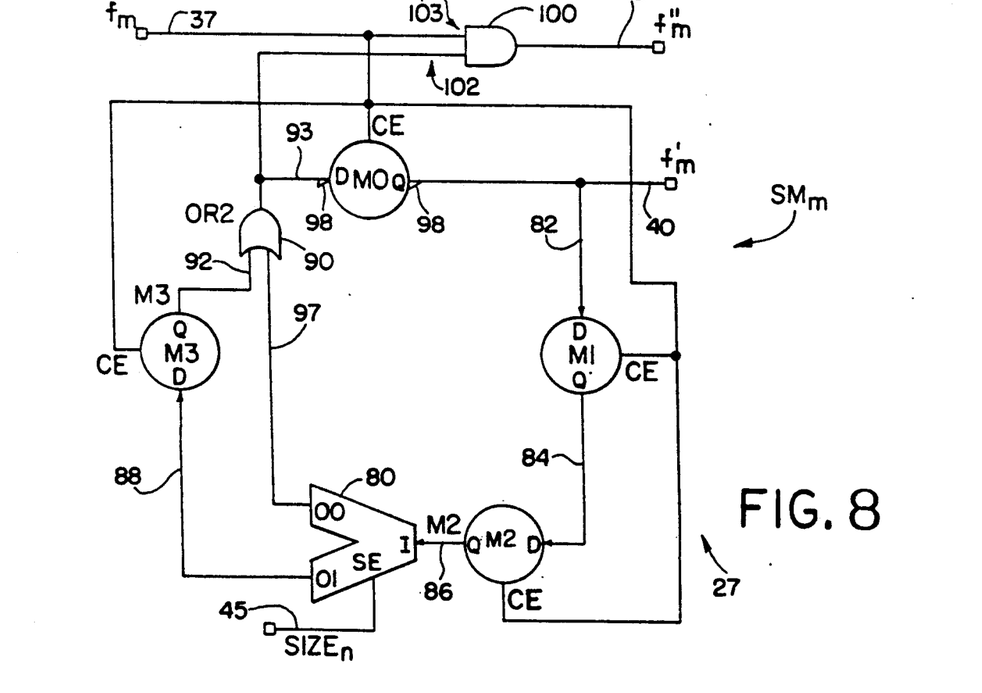
FIG. 8 is a schematic diagram of a second regulated digital divider circuit formed by a second finite state machine in the non-integral frequency divider of FIG. 6 in accordance with the present invention.
Figures 9, 10, 11, 12:
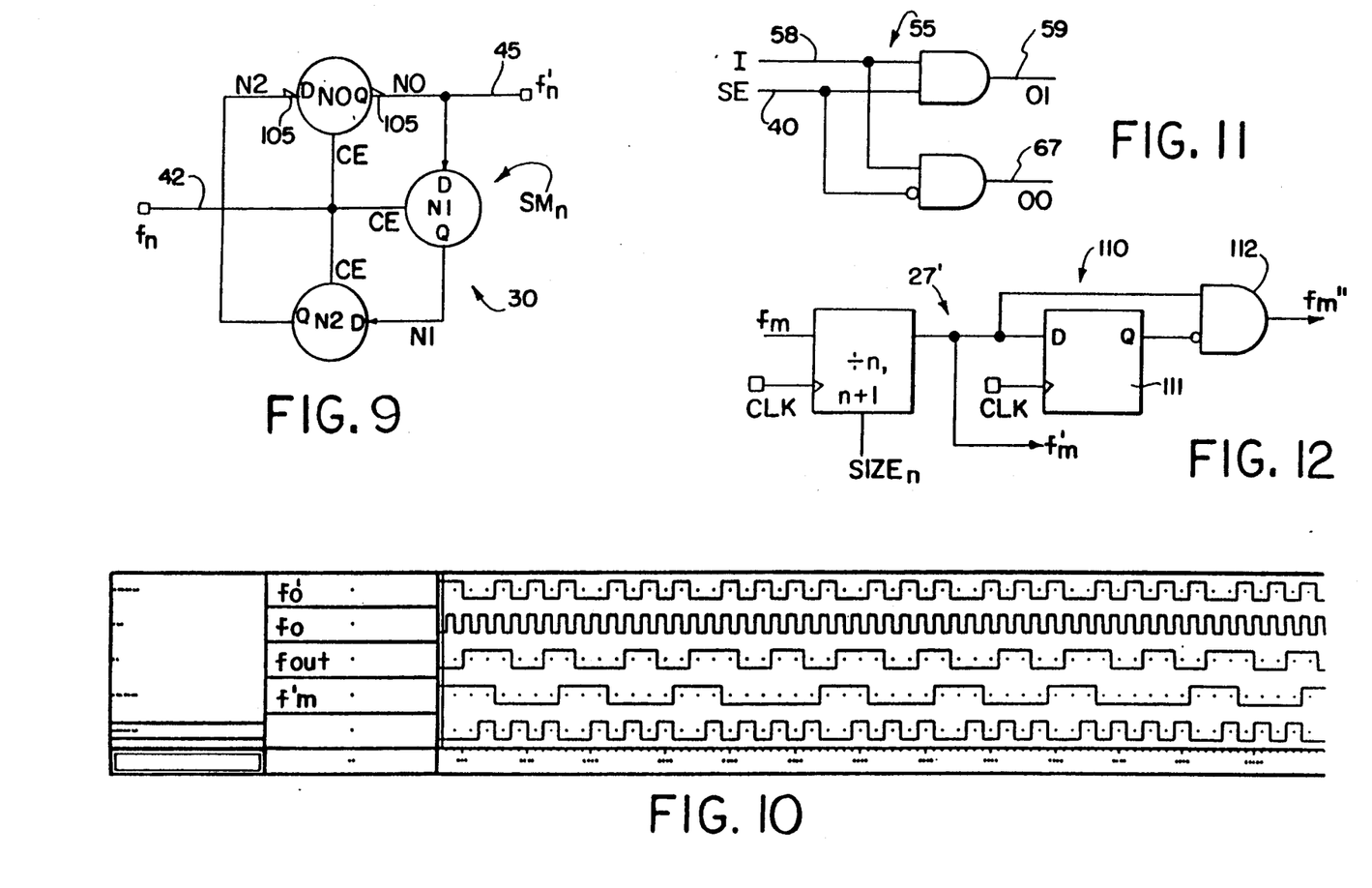
FIG. 9 is a schematic diagram of a feedback frequency divider formed by a third finite state machine in the non-integral frequency divider of FIG. 6 in accordance with the present invention.
FIG. 10 is a timing diagram for the non-integral frequency divider of FIG. 6 according to the present invention.
FIG. 11 is logic a logic diagram of an exemplary multiplexer used in accordance with the present invention.
FIG. 12 is a block diagram of another embodiment of a regulated digital divider circuit in accordance with the present invention.

Referring now to FIGS. 7-9, shown respectively are exemplary embodiments of the regulated digital divider circuits 25 and 27, and the feedback divider circuit 30. In this particular example, the regulated digital divider circuits and the feedback divider circuit are constructed using synchronous circuits as described below.

FIG. 7 illustrates in detail an exemplary embodiment of the first regulated digital divider circuit 25. The finite state machine $SM_o$ forming the first regulated digital divider circuit 25 includes three D-type flip flops O0, O1 and O2, each which provide a respective state in the state machine. The flip flops have a D-input and Q-output as is conventional, and receive the system clock signal at the terminal labelled CLK as is shown. The flip flops are combined using a multiplexer 55 to form a free running divide-by-2 counter or divide-by-3 counter depending on the value of the $size_m$, input provided to the multiplexer 55. When the $size_m$ input to multiplexer 55 is active, the state machine $SM_o$ is a divide-by-3 counter (the terms "counter" and "divider" are used interchangeably herein) in which a value initially stored in the flip flop O0 is successively toggled with the application of the clock enable signal through to the flip flop O1 via line 57, the flip flop O2 via the multiplexer 55 and lines 58 and 59, and back to the flip flop O0 via an OR gate 60 and lines 62 and 63.

When the $size_m$ input provided to the multiplexer 55 is inactive, the state machine $SM_o$ forms a divide-by-2 counter in which the value initially stored in the flip flop O0 is successively toggled with each application of the clock enable signal through to the flip flop O1 via line 57, and back to the flip flop O0 via line 58, the multiplexer 55, line 67, the OR gate 60, and line 63 as shown. The input frequency $f_o$ serves as the clock signal to each of the flip flops. The output of the OR gate 60 serves as the secondary output $f_o''$, and the inverted output of the flip flop O0 (via an inverter 70 as described below) serves as the primary output $f_o'$.

The first regulated digital divider circuit 25 is initialized during a system initialization in order to provide the desired 1:2/3 assertion of the output $f_o'$ as follows. The contents of the flip flop O0 are initially set to a logic "1", and the contents of the flip flops O1 and O2 are initially set to a logic "0". Because the flip flop O0 in this example includes inverters 70 at the D-input and Q-output, the $f_o'$ output will be a logic "0". With each clocking of the respective flip flops (via $f_o''$), the logic "1" contents originally stored in the flip flop O0 will rotate through the respective flip flops in a clockwise manner. When the logic "1" is stored in the flip flop O1 and the $size_m$ input to the multiplexer 55 is inactive, the secondary output $f_o''$ will be a logic "1", or active. When the logic "1" originally stored in the flip flop O0 is rotated through to the flip flop O2 as a result of the $size_m$ input having gone active, again the $f_o''$ output will go active via the OR gate 60.

FIG. 8 illustrates in detail an exemplary embodiment of the second regulated digital divider circuit 27. The finite state machine $SM_n$ forming the second regulated digital divider circuit 27 includes four D-type flip flops M0, M1, M2 and M3, each providing a respective state in the state machine. The flip flops are combined by a multiplexer 80 to form a divide-by-3 divider or a divide-by-4 divider depending on the value of the $size_n$ input provided to the multiplexer 80. When the $size_n$ input is active, the state machine $SM_n$ acts as a divide-by-4 counter in which a value initially stored in the flip flop M0 is successively toggled with the application of a clock enable signal through to the flip flop M1 via line 82, the flip flop M2 via line 84, the flip flop M3 via the multiplexer 80 and line 86 and 88, through an OR gate 90 via line 92, and back to the flip flop M0 via line 93.

When the $size_n$ input is inactive, the state machine $SM_n$ forms a divide-by-3 divider in which the value initially stored in the flip flop M0 is successively toggled through to the flip flop M1 via line 82, the flip flop M2 via line 84, through the multiplexer 80 via line 86, the OR gate 90 via line 97, and back to the flip flop M0 via line 93. The input frequency $f_m$ comprising the secondary output $f_o''$ serves as the clock enable signal to each of the flip flops. The output $f'_m$ consists of the inverted output of the flip flop M0 (using an inverter 98), and the output frequency $f''_m$ consists of the output of an AND gate 100 which ANDs the input frequency $f_m$ signal with the output of the OR gate 90.

The second regulated digital divider circuit 27 is initialized during a system initialization as follows. The contents of the flip flop M0 are set to a logic "1", and the contents of the remaining flip flops or set to a logic "0". Because the flip flop M0 in this example includes inverters 98 at the D-input and Q-output, the $f'_m$ output will initially be a logic "0". Thereafter, the logic "1" originally stored in the flip flop M0 will rotate through the respective flip flops with each clock enable in a clockwise manner as a function of the $size_n$ input provided to the multiplexer 80. When the logic "1" originally stored in the flip flop M0 becomes stored in the flip flop M2 and the $size_n$ input to the multiplexer is inactive, the logic "1" output from the flip flop M2 is delivered via line 97 and the OR gate 90 to an input 102 of the AND gate 100. Alternatively, when the logic "1" originally stored in the flip flop M0 becomes stored in the flip flop M3, the logic "1" is again coupled through the OR gate 90 and is provided to the input 102 of the AND gate 100.

The input 103 to the AND gate 100 is connected via line 37 to the $f_o''$ output provided from the first regulated digital divider circuit 25. As a result, a single clock period pulse is generated as the state machine $SM_m$ transitions to state M0.

Referring briefly to FIG. 9, the feedback divider circuit 30 consists of a divide-by-3 divider formed by a finite state machine $SM_n$. The feedback divider circuit 30 includes three D-type flip flops N0, N1 and N2, each representing a respective state, and having their respective inputs and outputs connected in series as is shown. The flip flop N0 includes an inverter 105 at its input and output, and the contents of the flip flop N0 are set to a logic "1" when the system is initialized. Similarly, the contents of the flip flops N1 and N2 are set to a logic "0" upon initialization. The input frequency $f_n$ comprising the output $f_m''$ serves as the clock enable signal to each of the respective flip flops as shown, and the logic "1" originally stored in the flip flop N0 is rotated successively through the respective flip flops in a clockwise manner with each clock enable signal. The output of the flip flop N0 functions as the $f'_n$ signal ($size_n$ signal) which is provided to the second regulated digital divider circuit as is noted above.

FIG. 10 is a timing diagram illustrating the operation of the non-integral frequency divider 15''' according to Example 3. Shown are the waveforms for the input $f_o$ and the outputs $f_o'$, $f_{out}$ and $f'_m$.

The multiplexers discussed above (e.g., 55 and 80) can be implemented using a few simple logic gates as will be appreciated. For example, FIG. 11 is a logic diagram of the multiplexer 55 consisting of a pair of AND gates. Various other circuit configurations for the multiplexers can be used without departing from the scope of the present invention.

The finite state machines used in the non-integral divider circuit 15''' can be formed using a gate architecture using the commercially available Xilinx FPGA design package. A typical application of the non-integral divider circuit 15''' would be to divide the 16.78 MHz CPU clock from a Motorola MC68340 processor by 41/9 to generate a 3.683 MHz signal which drives the clock for the processor's baud rate generator. The exemplary non-integral divider circuit 15''' requires only ten D-type flip flops and a few logic gates as is noted above.

The output signal generated by the non-integral divider 15''' is within 0.1% of the nominal 3.6864 MHz, which is quite sufficient for most applications. However, if an absolutely precise divider were required (where m/n=1024/225), the non-integral frequency divider 15''' could be produced by replacing the divide-by-3 feedback frequency divider circuit 30 with additional cascaded digital divider circuits applying the above-described principles as follows: a divide-by-2 or -3 regulated digital divider circuit, which is regulated by a divide-by-3 or -4 regulated digital divider circuit, which in turn is regulated by a divide-by-3 or-4 regulated digital divider circuit, which is regulated by a divide-by-2 feedback frequency divider circuit. Such a divider would require approximately an additional 10 D-type flip flops and a few additional logic gates.

Thus, the present invention provides a non-integral frequency divider which produces a digital signal at an output frequency $f_o$ related to a higher frequency input signal $f_o$ by an arbitrary, non-integral ratio (m/n). The present invention has particular utility in situations where a signal is to be sampled at the input signal $f_o$ frequency and need only be precise at the sample point, or where errors in short term phase accuracy and waveform shape are acceptable. The present invention can be used to replace relatively expensive stand-alone precision oscillators and complex phase locked loop circuits ordinarily used to obtain multiple, non-integral related signal frequencies.

In addition, the present invention can be used to replace higher cost non-integral divider circuits using ring counters or shift registers, for example. In order to provide an arbitrary division ratio, it has been approximated that a non-integral divider circuit constructed in accordance with the present invention requires, on average, one-fifth the number of flip flops necessary to provide the same degree of precision using a divider circuit with ring counters as described in U.S. Pat. No. 3,818,354; and less than the square root of the number of flip flops required using a divider circuit with shift registers as described in U.S. Pat. 4,555,793.

Moreover, the non-integral frequency divider of the present invention does not require that the contents of one or more shift registers be preloaded prior to a division operation as required with the divider circuit described in the '354 and '793 patents. Furthermore, the non-integral frequency divider of the present invention can be designed for any division ratio m/n, particularly in the range of 1:1 to 1:N, where N is an integer value.

Although the invention has been shown and described with respect to certain preferred embodiments, it is obvious that equivalents and modifications will occur to others skilled in the art upon the reading and understanding of the specification.

For example, while the invention is described above using finite state machines constructed primarily of D-type flip flops, it will be appreciated that other type flip flops or memory devices can be used without departing from the scope of the invention. The respective finite state machines can be designed using any number of conventional design techniques, and are preferably minimized with respect to component cost using conventional state minimization techniques.

Furthermore, different techniques can be employed for generating the secondary outputs (e.g., $f_m''$) referred to above for a synchronous embodiment of the present invention. For example, FIG. 12 illustrates another embodiment of the regulated digital divider circuit 27, designated 27'. Rather than utilizing the output of an AND gate 100 (FIG. 8) as the secondary output $f_m''$ to clock synchronously the next divider circuit, an edge detect circuit 110 comprises a D-type flip flop 111 having its input and output connected, respectively, to the non-inverted and inverted inputs of an AND gate 112. The output of the AND gate 112 serves as the secondary output $f_m''$. Otherwise, the circuit shown in FIG. 12 is identical to that shown in FIG. 8.

The present invention includes all such equivalents and modifications, and is limited only by the scope of the following claims.

What is claimed is:

1. A non-integral frequency divider circuit, comprising:
   first finite state machine means for selectively dividing an input by a first value or a second value as a function of a control input, thereby providing an output;
   second finite state machine means for providing said control input: and
   wherein said second finite state machine means comprises means for dividing said output of said first finite state machine means by a third value, an output of said second finite state machine serving as said control input to said first finite state machine means.

2. The divider circuit of claim 1, wherein said output of said first finite state machine approximates a square wave.

3. The divider circuit of claim 1, wherein said first and second finite state machines each comprise a plurality of flip flops.

4. The divider circuit of claim 3, wherein said flip flops are D-type flip flops.

5. The divider circuit of claim 1, wherein said first finite state machine provides a division ratio within the range of 1:1 to 1:N.

6. The divider circuit of claim 1, wherein said first and second finite state machines are substantially minimized.

7. A non-integral frequency divider circuit, comprising:
   a plurality of finite state machines, each of said finite state machines comprising regulated divider means for selectively dividing an input frequency by a first value or a second value as a function of a control input; and
   wherein said plurality of finite state machines are cascaded together in series such that an output of one of said finite state machines serves as said input to a next of said finite state machines in said series, and an output of said next finite state machine serves as said control input to said one finite state machine in said series.

8. The divider circuit of claim 7, further comprising fixed dividing means for dividing said output of said next finite state machine by another value, and wherein an output of said fixed dividing means serves as the respective control input to said next finite state machine.

9. The divider circuit of claim 7, wherein an output of said divider circuit approximates a square wave.

10. The divider circuit of claim 7, wherein each of said finite state machines comprise a plurality of flip flops.

11. The divider circuit of claim 10, wherein said flip flops are D-type flip flops.

12. The divider circuit of claim 7, wherein a division ratio provided by said divider circuit is within the range of 1:1 to 1:N.

13. The divider circuit of claim 7, wherein each of said finite state machines is substantially minimized.

* * * * *